(12) United States Patent
Hemley et al.

(10) Patent No.: US 7,157,067 B2
(45) Date of Patent: *Jan. 2, 2007

(54) TOUGH DIAMONDS AND METHOD OF MAKING THEREOF

(75) Inventors: Russell J. Hemley, Chevy Chase, MD (US); Ho-Kwang Mao, Washington, DC (US); Chih-shiue Yan, Washington, DC (US)

(73) Assignee: Carnegie Institution of Washington, Washington, DC (US)

(*) Notice: Subject to any disclaimer, the term of this patent is extended or adjusted under 35 U.S.C. 154(b) by 16 days.

This patent is subject to a terminal disclaimer.

(21) Appl. No.: 10/889,169

(22) Filed: Jul. 13, 2004

(65) Prior Publication Data

US 2005/0011433 A1   Jan. 20, 2005

Related U.S. Application Data

(60) Provisional application No. 60/486,435, filed on Jul. 14, 2003.

(51) Int. Cl.
*C30B 29/04* (2006.01)
*C30B 25/00* (2006.01)
*C01B 31/06* (2006.01)

(52) U.S. Cl. ............................ 423/446; 117/103
(58) Field of Classification Search ............ 423/446; 117/103

See application file for complete search history.

(56) References Cited

U.S. PATENT DOCUMENTS 6,582,513 B1 * 6/2003 Linares et al. ............. 117/93

2003/0230232 A1   12/2003 Frushour et al. ............ 117/68

FOREIGN PATENT DOCUMENTS

WO    WO 01/96633 A1   12/2001

OTHER PUBLICATIONS

Yan, C-s., H-k. Mao, W. Li, J. Qian, Y. Zhao, & R.J. Hemley, "Ultrahard diamond single crystals from chemical vapor deposition" Phys. Stat. Sol. (a) 201, R25-R27 (2004).*
Diamond 2003—Oral Programme, 14 European Conference on Diamond, Diamond-like Materials, Carbon Nanotubes, Nitrides and Silicon Carbide.
Chih-shiue Yan et al., "Very high growth rate chemical vapor deposition of single-crystal diamond" Oct. 1, 2002, vol. 99 No. 20, pp. 12523-12525.
Jan Isberg et al., "High Carrier Mobility in Single-Crystal Plasma-Deposited Diamond" Science, vol. 297, Issue 5587, 1670-1672, Sep. 6, 2002 [DO1: 10.1126/science.1074374].
Takahiro Imai et al., Systhesis of Large Free-Standing Diamond Single Crystals By Homoepitaxial Growth.
Patrick Doering et al., Large Area Crystal DVD Diamond: Properties and Applications.

(Continued)

*Primary Examiner*—Stuart L. Hendrickson
*Assistant Examiner*—Alvin T Raetzsch
(74) *Attorney, Agent, or Firm*—Morgan Lewis & Bockius LLP

(57) ABSTRACT

A single crystal diamond grown by microwave plasma chemical vapor deposition has a hardness of 50–90 GPa and a fracture toughness of 11–20 MPa $m^{1/2}$. A method for growing a single crystal diamond includes placing a seed diamond in a holder; and growing single crystal diamond at a temperature of about 1000° C. to about 1100° C. such that the single crystal diamond has a fracture toughness of 11–20 MPa $m^{1/2}$.

3 Claims, 4 Drawing Sheets

OTHER PUBLICATIONS

Tetsuo Irifune et al., "Materials: Ultrahard Polycrystalline Diamond From Graphite", Nature 421, 599-600 (Feb. 6, 2003): doi:10.1038/421599b.

Wuyi Wang, Featured Lab Note: Another Commercial U.S. Facility Offers HPHT Annealing, Summer 2002, Gems & Gemology, vol. 38, Issue 2, Jul. 29, 2004.

M. D. Drory et al. "Fracture of Synthetic Diamond", Department of Materials Science and Engineering, (Received Mar. 10, 1995; accepted for publication May 11, 1995).

J.E. Shigley, et al., "Gemological Identification of HPHT-Annealed Diamonds", Seventh Annual V.M. Goldschmidt Conference (2001).

* cited by examiner

US 7,157,067 B2

TOUGH DIAMONDS AND METHOD OF MAKING THEREOF

The present invention claims the benefit of Provisional Application No. 60/486,435 filed on Jul. 14, 2003, which is hereby incorporated by reference.

STATEMENT OF GOVERNMENT INTEREST

This invention was made with U.S. government support under grant number EAR-0135626 from the National Science Foundation. The U.S. government has certain rights in the invention.

BACKGROUND OF THE INVENTION

1. Field of the Invention

The present invention relates to diamonds, and more particularly, to a tough diamond produced using Microwave Plasma Chemical Vapor Deposition (MPCVD) within a deposition chamber.

2. Description of Related Art

Large-scale production of synthetic diamond has long been an objective of both research and industry. Diamond, in addition to its gem properties, is the hardest known material, has the highest known thermal conductivity, and is transparent to a wide variety of electromagnetic radiation. It is valuable because of its wide range of applications in a number of industries, in addition to its value as a gemstone. However, a diamond can have low fracture toughness that will makes it unsuitable for many applications, such as a high impact machine tools.

For at least the last twenty years, a process of producing small quantities of diamond by chemical vapor deposition (CVD) has been available. As reported by B. V. Spitsyn et al. in "Vapor Growth of Diamond on Diamond and Other Surfaces," Journal of Crystal Growth, vol. 52, pp. 219–226, the process involves CVD of diamond on a substrate by using a combination of methane, or another simple hydrocarbon gas, and hydrogen gas at reduced pressures and temperatures of 800–1200° C. The inclusion of hydrogen gas prevents the formation of graphite as the diamond nucleates and grows. Growth rates of up to 1 μm/hour have been reported with this technique.

Subsequent work, for example, that of Kamo et al. as reported in "Diamond Synthesis from Gas Phase in Microwave Plasma," Journal of Crystal Growth, vol. 62, pp. 642–644, demonstrated the use of Microwave Plasma Chemical Vapor Deposition (MPCVD) to produce diamond at pressures of 1–8 Kpa in temperatures of 800–1000° C. with microwave power of 300–700 W at a frequency of 2.45 GHz. A concentration of 1–3% methane gas was used in the process of Kamo et al. Maximum growth rates of 3 μm/hour have been reported using this MPCVD process.

In the above-described processes, and in a number of more recently reported processes, the fracture toughness of the diamonds is better in some instances than natural diamond. In particular, higher-growth rate processes that only produce or grow polycrystalline forms of diamond are known to produce diamond having a fracture toughness higher than natural diamond. Other than some high pressure high pressure (HPHT) synthetic diamonds, which have been annealed, most diamonds have a fracture toughness of less than 11 MPa m$^{1/2}$.

SUMMARY OF THE INVENTION

Accordingly, the present invention is directed to a an apparatus and a method for producing diamond that substantially obviates one or more of the problems due to limitations and disadvantages of the related art.

An object of the present invention relates to an apparatus and method for producing diamond in a microwave plasma chemical vapor deposition system having increased fracture toughness.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a single crystal diamond grown by microwave plasma chemical vapor deposition has a hardness of 50–90 GPa and a fracture toughness of 15–20 MPa m$^{1/2}$.

In another embodiment, a single crystal diamond has a fracture toughness of 18–20 MPa m$^{1/2}$.

In accordance with another embodiment of the present invention, a method for growing a single crystal diamond includes placing a seed diamond in a holder and growing single crystal diamond at a temperature of about 1000° C. to about 1100° C. such that the single crystal diamond has a fracture toughness of 11–20 MPa m$^{1/2}$.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, the results of which are illustrated in the accompanying drawings.

The microwave plasma CVD-grown single-crystal diamond referred to in this application were grown with the apparatus described in U.S. patent application Ser. No. 10/288,499 filed on Nov. 6, 2002 entitled "Apparatus and Method for Diamond Production," which is hereby incorporated by reference. In general, a seed diamond is placed in holder that moves the seed diamond/grown diamond as the diamond is grown. The inventors of this application are also inventors in U.S. patent application Ser. No. 10/288,499.

A microwave plasma CVD-grown single-crystal diamond having a thickness of greater than 1 millimeter was deposited on type Ib {100} synthetic diamond. In order to enhance the growth rate (50–150 μm/h) and promote smooth {100} face growth, single-crystal diamonds were grown in an atmosphere of $N_2/CH_4=0.2–5.0\%$, $CH_4/H_2=12–20\%$, 120–220 torr total pressure, and 900–1500° C. from a microwave induced plasma within a CVD chamber. Raman spectra show a small amount of hydrogenated amorphous carbon (a-C:H)[4] and nitrogen-containing a-C:H (N:a-C:H)[4] giving rise to brown diamond at <950° C. and >1400° C. Photoluminescence (PL) spectra indicate nitrogen-vacancy (N-V) impurities. Single crystal diamonds up to 4.5 mm in thickness have been fabricated at growth rates that are as much as two orders of magnitude higher than conventional polycrystalline CVD growth methods.

Figure 1:
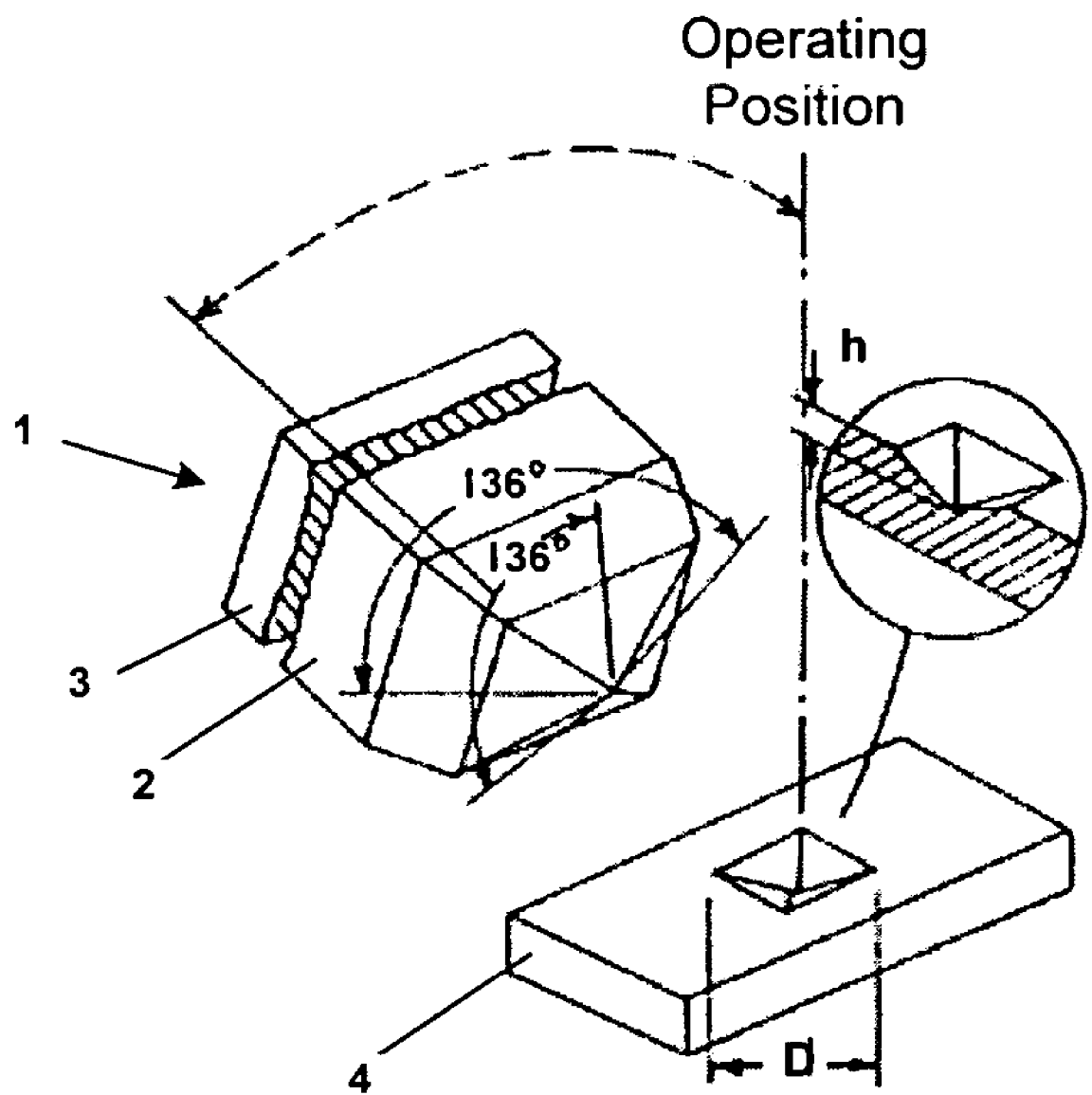
FIG. 1 is a diagram of an indenter for testing the hardness and fracture toughness of a diamond.

FIG. 1 is a diagram of an indenter for testing the hardness and fracture toughness of a diamond. Vickers hardness and fracture toughness tests were performed on microwave plasma CVD-grown single-crystal diamonds with the indenter 1 shown in FIG. 1. The indenter 1 in FIG. 1 has an impinging material 2 positioned on a mount 3. The impinging material 2 can be silicon carbide, diamond or some other hard material. The impinging material has a face with a pyramidal Vickers indenter shape in which the sides of the pyramidal Vickers indenter shape have an angle of 136°.

Figure 2:
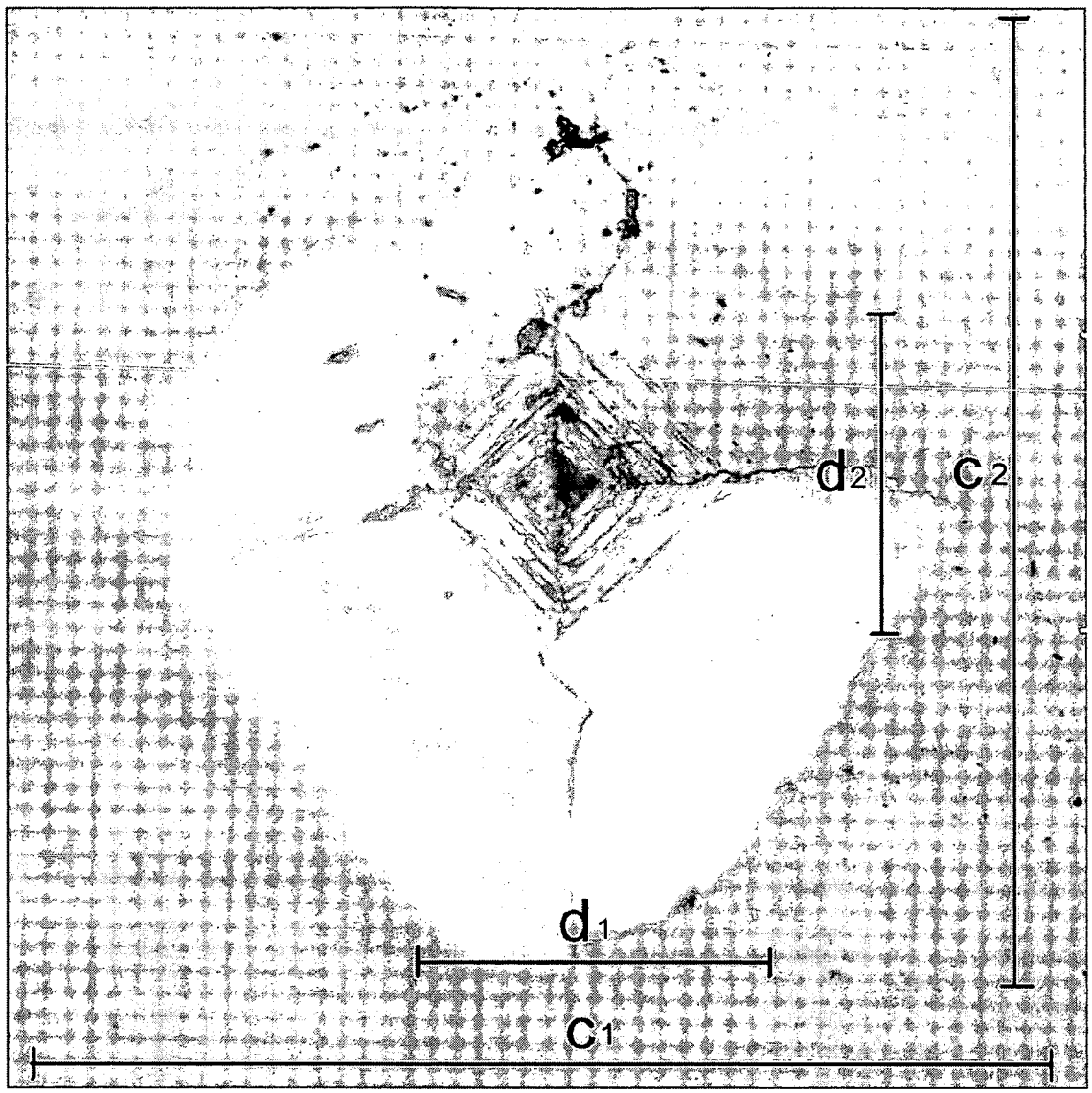
FIG. 2 is a picture of an indentation made on a microwave plasma CVD-grown single-crystal diamond.

The indenter applies a point load to the test diamond 2 until an indentation or crack is formed in the test diamond 2. To prevent elastic deformation of the indenter, the loads were varied from 1 to 3 kg on {100} faces in the <100> direction of the test diamonds. FIG. 2 is a picture of an indentation made on a microwave plasma CVD-grown single-crystal diamond. Dimensions of the indentation and the cracks associate with the indentation are measured via optical microscopy.

By measuring the length D and height h of the indentation, the hardness $H_v$ of the test diamond can be determined from the following equation (1):

$$H_v = 1.854 \times P/D^2 \quad (1)$$

P is the maximum load used on the indenter to form an indentation into the test diamond. D is the length of the longest crack formed by the indenter in the test diamond and h is the depth of the indentation into the test diamond, as shown in FIG. 1.

The fracture toughness $K_c$ of the test diamond can be determined by using the hardness $H_v$ from equation (1) in the following equation (2):

$$K_C = (0.016 \pm 0.004)(E/H_V)^{1/2}(P/C^{3/2}) \quad (2)$$

E is the Young's modulus, which is assumed to be 1000 GPa. P is the maximum load used on the indenter to form the indentation into the test diamond. The term d is the average length of the indentation cavity in the test diamond, as shown in FIG. 2 such that $d=(d_1+d_2)/2$. The term c is the average length of the radial cracks in the test diamond, as shown in FIG. 2 such the $c=(c_1+c_2)/2$.

Figure 3:
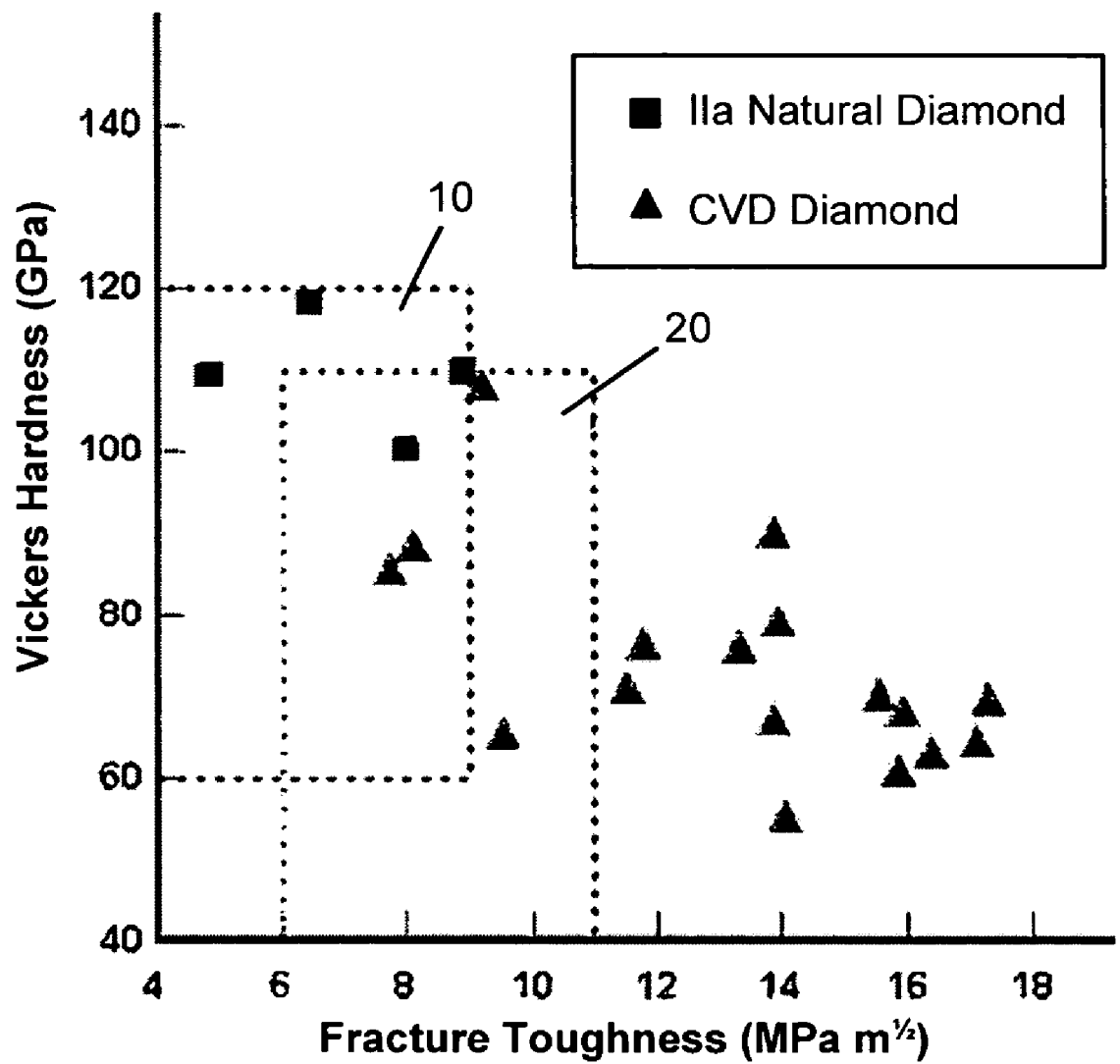
FIG. 3 is a graph showing the hardness and toughness of microwave plasma CVD-grown single-crystal diamonds in comparison to type IIa natural diamonds.

FIG. 3 is a graph showing the hardness and toughness of microwave plasma CVD-grown single-crystal diamonds in comparison to type IIa natural diamonds. The microwave plasma CVD-grown single-crystal diamonds shown in FIG. 3 were grown at temperatures around 1300° C. so as to achieve a high growth rate. As shown in FIG. 3, the microwave plasma CVD-grown single-crystal diamonds have much higher fracture toughness of 6–18 MPa $m^{1/2}$ relative to the natural IIa diamond. Most of the microwave plasma CVD-grown single-crystal diamonds have a higher fracture toughness than the reported range of fracture toughness for type IIa natural diamonds, shown by the dotted square 10 in FIG. 3, and the reported range of fracture toughness for polycrystalline CVD diamonds, shown by the dotted square 20 in FIG. 3. The microwave plasma CVD-grown single-crystal diamonds represented in FIG. 3 have a fracture toughness of 11–18 MPa $m^{1/2}$ with a hardness of 50–90 GPa.

The differences in fracture toughness for the microwave plasma CVD-grown single-crystal diamonds represented in FIG. 3 appeared somewhat to correlate with processing temperature. Accordingly, the present inventors grew additional microwave plasma CVD-grown single-crystal diamonds within specific processing temperature ranges. In other words, a seed diamond was placed in a holder and single crystal diamond was grown within a specified processing temperature range. These additional microwave plasma CVD-grown single-crystal diamonds were then subjected to the same hardness and fracture toughness testing.

Figure 4:
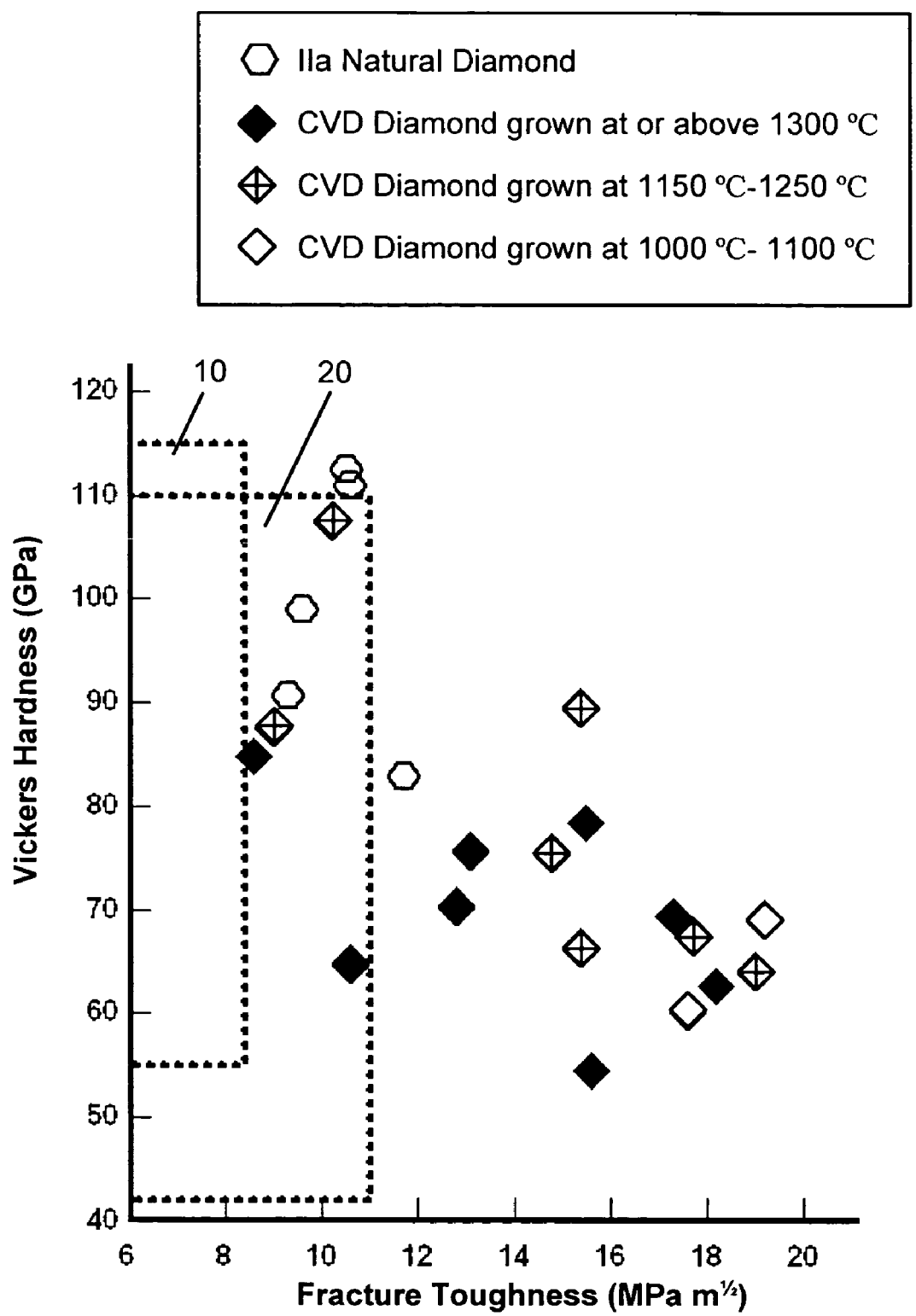
FIG. 4 is a graph showing the hardness and toughness of microwave plasma CVD-grown single-crystal diamonds, which were formed at different temperatures in comparison to type IIa natural diamonds.

FIG. 4 is a graph showing the hardness and toughness of microwave plasma CVD-grown single-crystal diamonds, which were formed at different temperatures in comparison to type IIa natural diamonds. More specifically, FIG. 4 shows the hardness and toughness of microwave plasma CVD-grown single-crystal diamonds that are respectively formed at above 1300° C., 1150° C.–1250° C., and 1000° C.–1100° C. As shown in FIG. 4, the microwave plasma CVD-grown single-crystal diamonds that were grown at 1000° C.–1100° C. have a fracture toughness of about 18–20 MPa $m^{1/2}$ with a hardness of 60–70 GPa.

Although growth rate of the single crystal diamonds are slower, a single crystal diamonds 1000° C.–1100° C. can be produced having a high fracture toughness of 18–20 MPa $m^{1/2}$. No other diamonds, synthetic or natural, have been reported as having such a high fracture toughness. Further, diamonds grown at higher temperatures, such as 1150° C.–1350° C., may not necessarily achieve a high fracture toughness but tend to have a high hardness that makes such diamonds useful for other purposes.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for growing a single crystal diamond using microwave plasma chemical vapor deposition comprising:
    placing a seed diamond in a holder; and
    growing single crystal diamond at a temperature of about 1000° C. to about 1100° C., in an atmosphere of $N_2/CH_4=0.2–5.0\%$ and $CH_4/H_2=12–20\%$ and at a total pressure of 120–220 torr such that the single crystal diamond has a fracture toughness of 11–20 MPa $m^{1/2}$.

2. The method of claim 1, wherein growing single crystal diamond results in a single crystal diamond having a hardness of 60–70 GPa.

3. The method of claim 1, wherein the fracture toughness is from 18–20 MPa $m^{1/2}$.

* * * * *